(12) United States Patent
Bhatti et al.

(10) Patent No.: US 7,486,110 B2
(45) Date of Patent: Feb. 3, 2009

(54) LUT BASED MULTIPLEXERS

(75) Inventors: Naresh Kumar Bhatti, New Delhi (IN); Sonia Singhal, New Delhi (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 28 days.

(21) Appl. No.: 11/234,862

(22) Filed: Sep. 23, 2005

(65) Prior Publication Data
US 2006/0097752 A1 May 11, 2006

(30) Foreign Application Priority Data
Sep. 24, 2004 (IN) .................. 1817/DEL/2004

(51) Int. Cl.
*H03K 19/173* (2006.01)

(52) U.S. Cl. .................. 326/38; 327/407

(58) Field of Classification Search .................. 326/38, 326/40–41, 47; 327/407
See application file for complete search history.

(56) References Cited

U.S. PATENT DOCUMENTS

| | | | |
|---|---|---|---|
| 6,118,300 A * | 9/2000 | Wittig et al. .................. 326/41 |
| 6,208,163 B1 * | 3/2001 | Wittig et al. .................. 326/39 |
| 6,466,052 B1 | 10/2002 | Kaviani |
| 6,489,830 B1 | 12/2002 | Kostarnov |
| 6,505,337 B1 | 1/2003 | Wittig et al. |
| 6,798,240 B1 * | 9/2004 | Pedersen .................. 326/39 |
| 6,888,373 B2 * | 5/2005 | Kaptanoglu et al. .......... 326/40 |
| 6,943,580 B2 * | 9/2005 | Lewis et al. .................. 326/40 |
| 7,010,777 B1 * | 3/2006 | Hutton et al. .................. 716/19 |
| 7,323,904 B2 * | 1/2008 | Veredas-Ramirez et al. ... 326/41 |
| 2004/0105207 A1 * | 6/2004 | Spaderna et al. ............ 361/115 |
| 2004/0155677 A1 * | 8/2004 | Lewis et al. .................. 326/40 |
| 2005/0146352 A1 * | 7/2005 | Madurawe .................. 326/41 |

* cited by examiner

*Primary Examiner*—James H. Cho
*Assistant Examiner*—Jason Crawford
(74) *Attorney, Agent, or Firm*—Lisa K. Jorgenson; Jose Gutman; Fleit Gibbons Gutman Bongini & Bianco P.L.

(57) ABSTRACT

An improved LUT based multiplexer, including a first set of muxlets, each receiving a subset of input data lines at its inputs and one or more muxlet stages cascaded together to form a tree structure in which the roots are the first set of muxlets and the last stage of muxlet produces the final output.

8 Claims, 13 Drawing Sheets

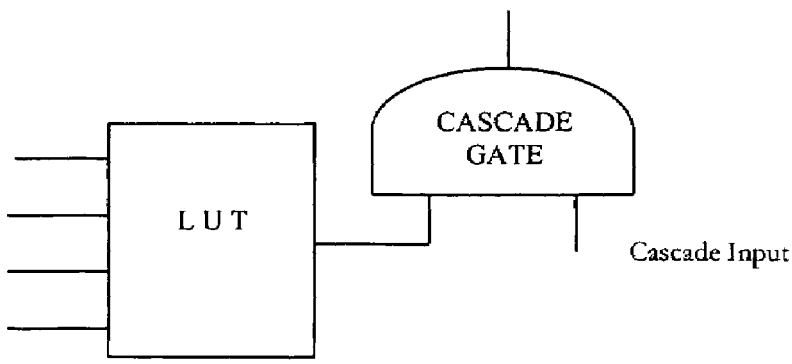
Figure 1 A) A LUT logic architecture with a cascade gate. The gate can be Nand, Nor, Or, And, etc.
PRIOR ART
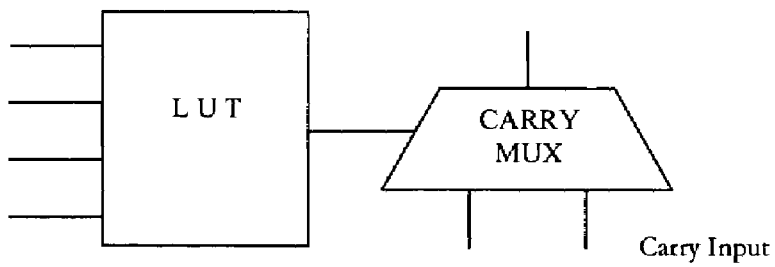
Figure 1 B) A LUT logic architecture with a carry multiplexer.
PRIOR ART

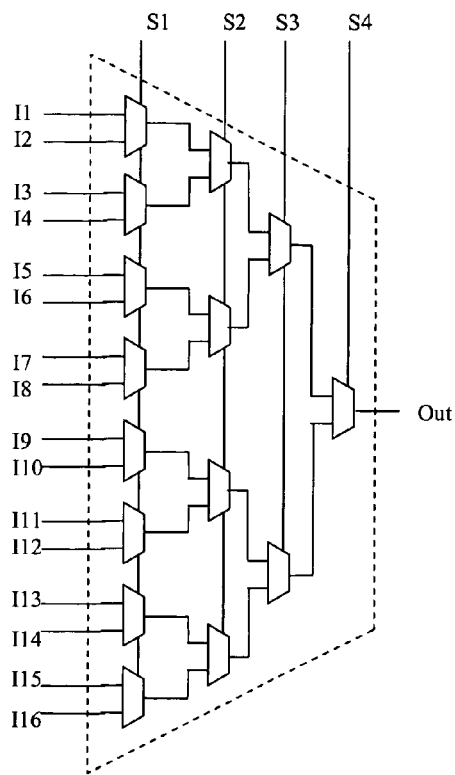
Figure 2A) Multiplexer implementation by generating a tree of 2:1 multiplexers
PRIOR ART
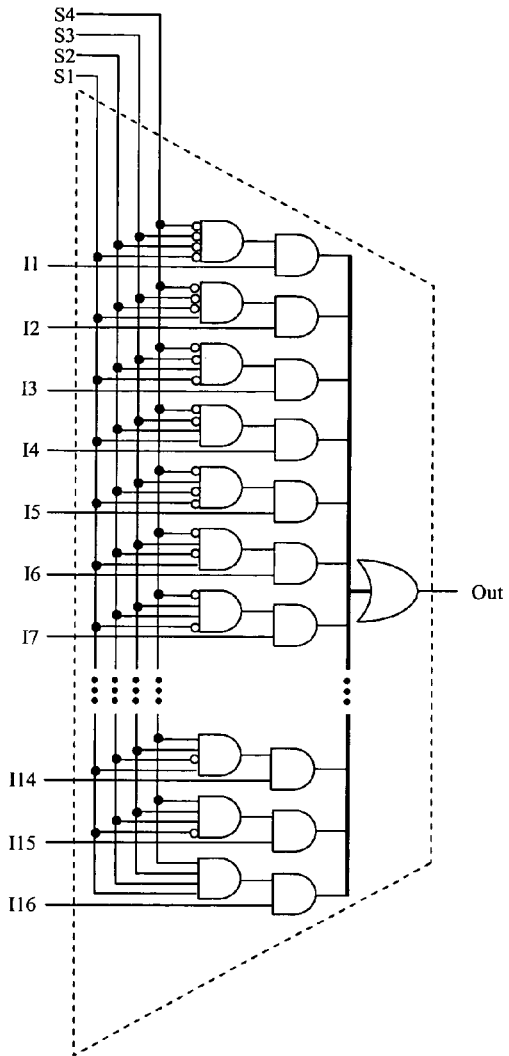
Figure 2B) Multiplexer implementation using a complete decoding scheme.
PRIOR ART

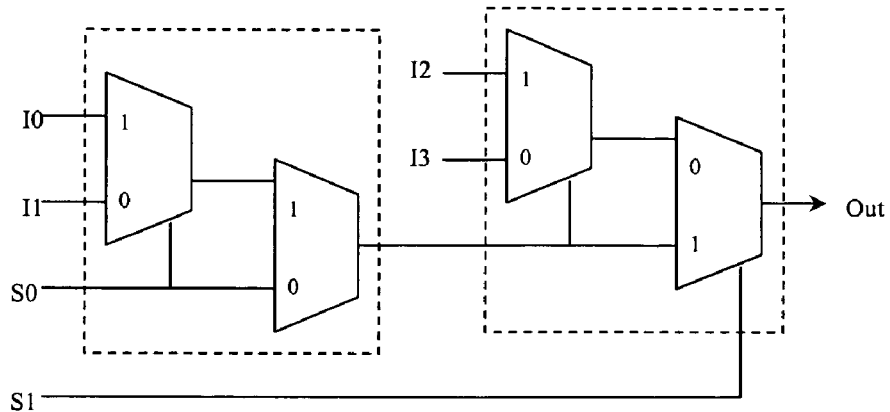
Figure 2C) Multiplexer implementation
using two 4-input LUTs
PRIOR ART
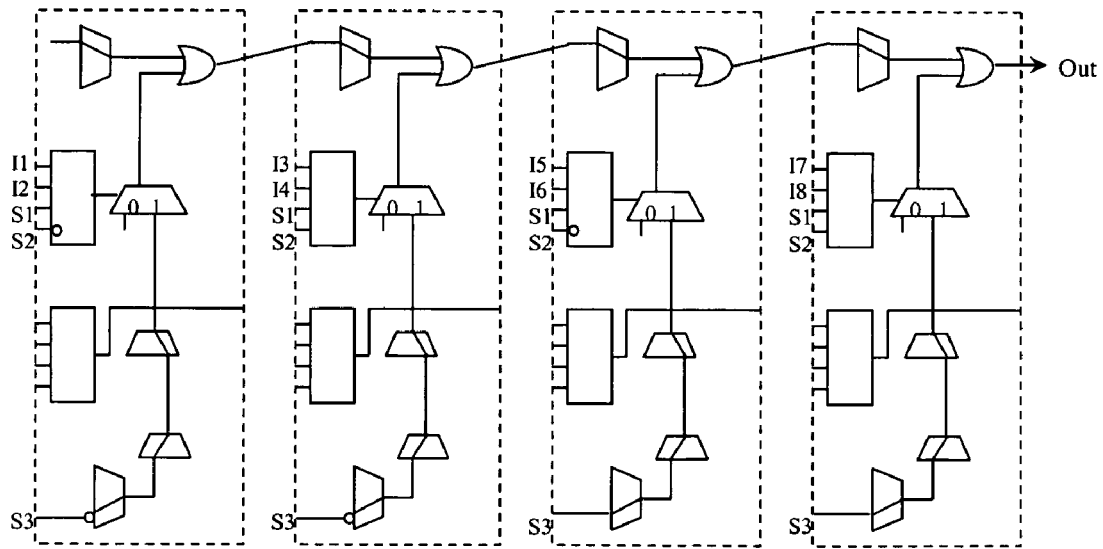
Figure 2D) Multiplexer implementation using four 4-input LUTs, carry chain
and horizontal OR chain on Virtex-II FPGA.
PRIOR ART

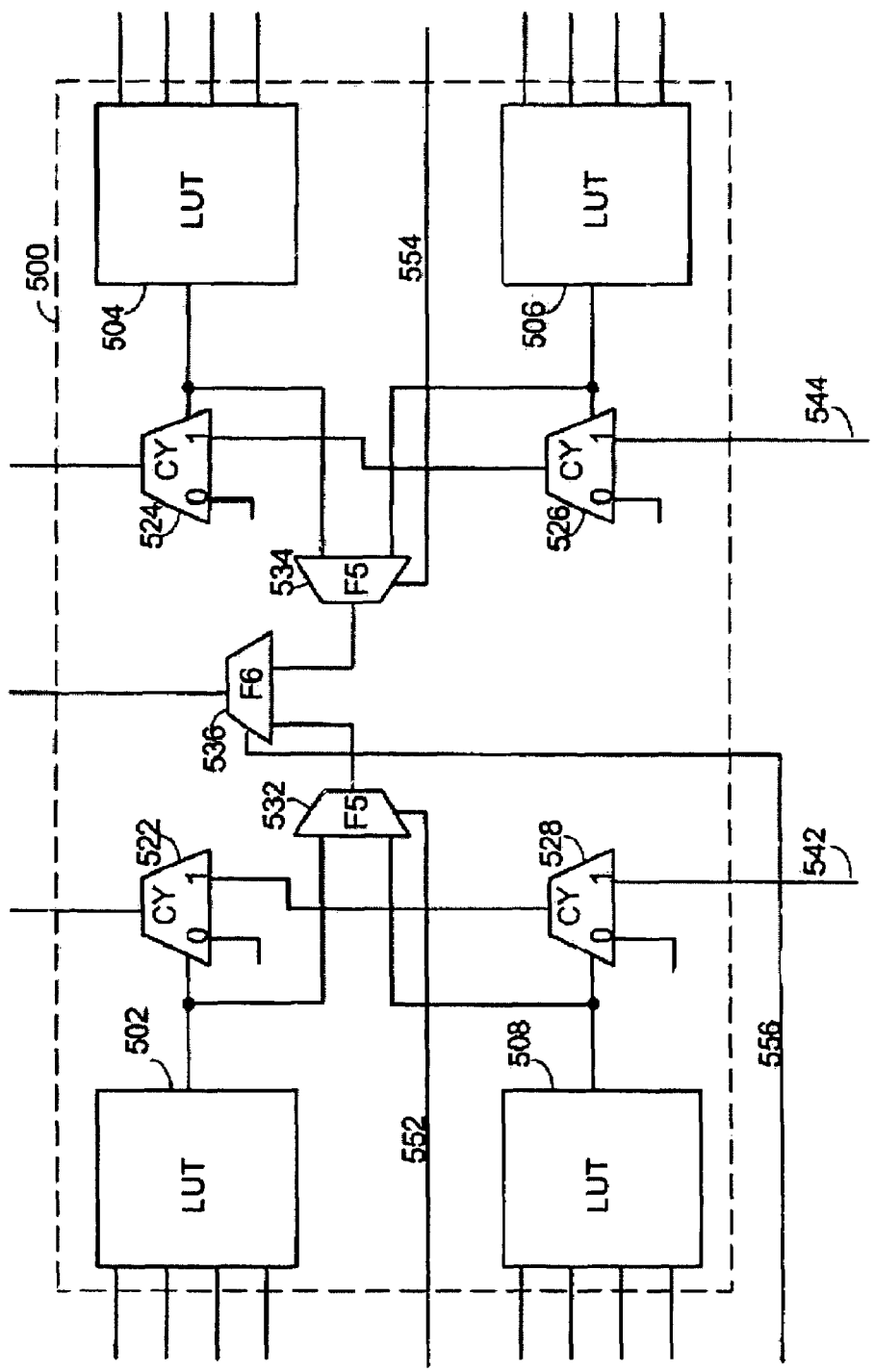
Figure 2E Multiplexer implementation according to USP 6505337
PRIOR ART

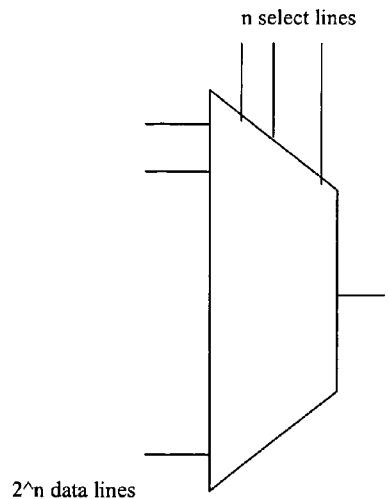
Figure 3. A) 2^n to 1 Multiplexer
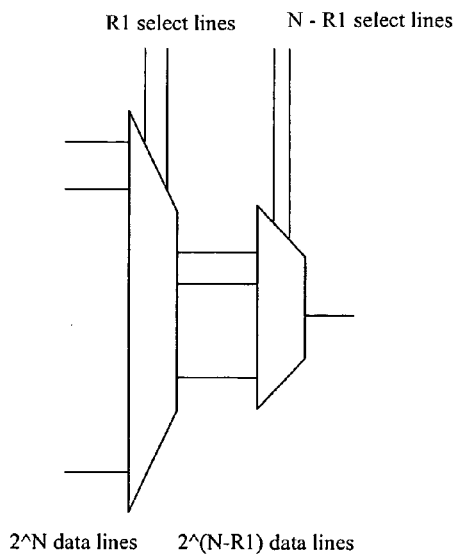
Figure 3. B) Multiplexer implementation using a Muxlet of R1 select lines and a multiplexer f (N − R1) select line
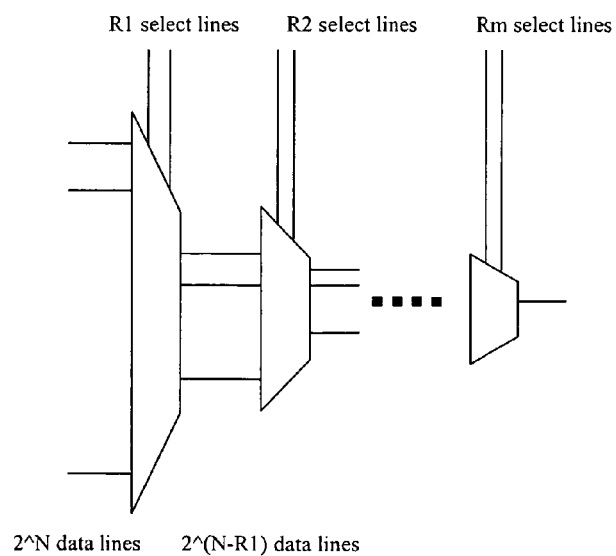
Figure 3. C) Multiplexer implementation using Muxlet of R1, R2, ...Rm select lines where n = R1 + R2 + ... Rm.

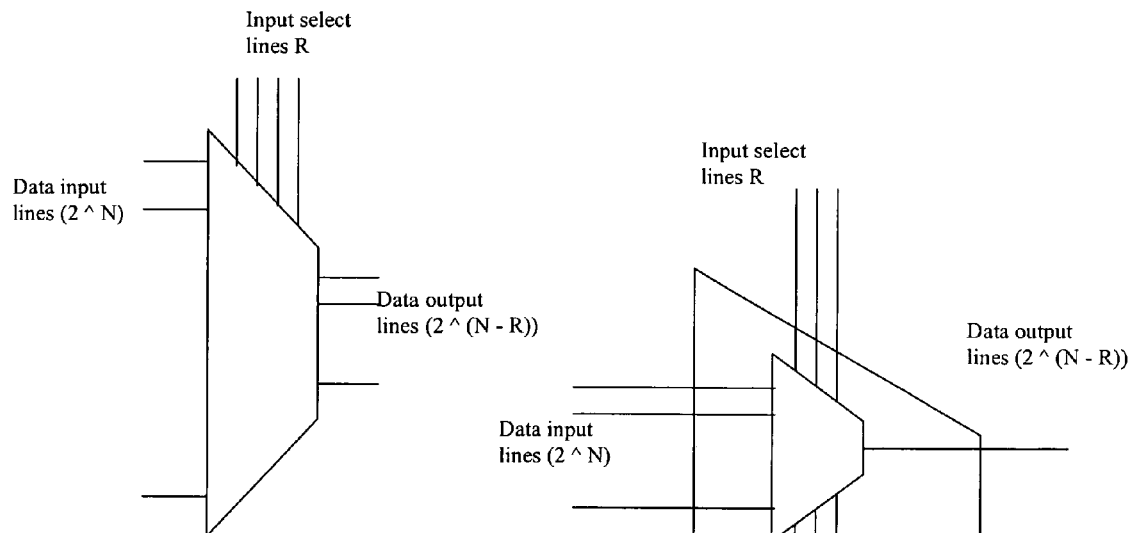
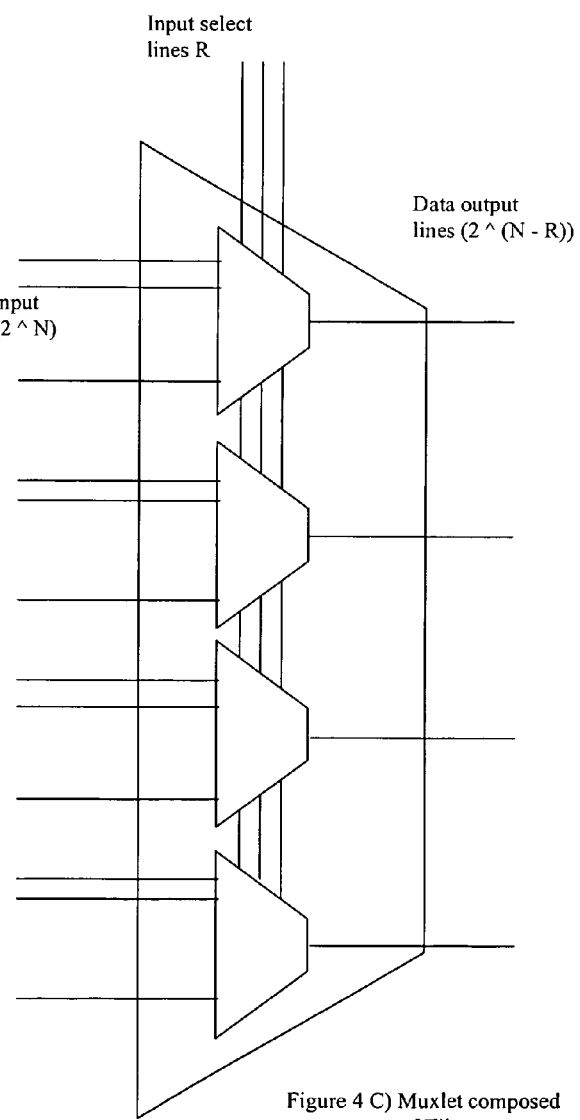
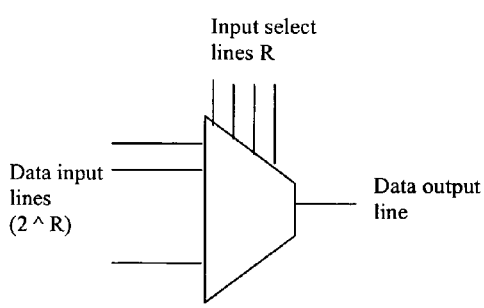
Figure 4 A) Muxlet
Figure 4 B) Muxlet Tile
Figure 4 C) Muxlet composed of Tiles

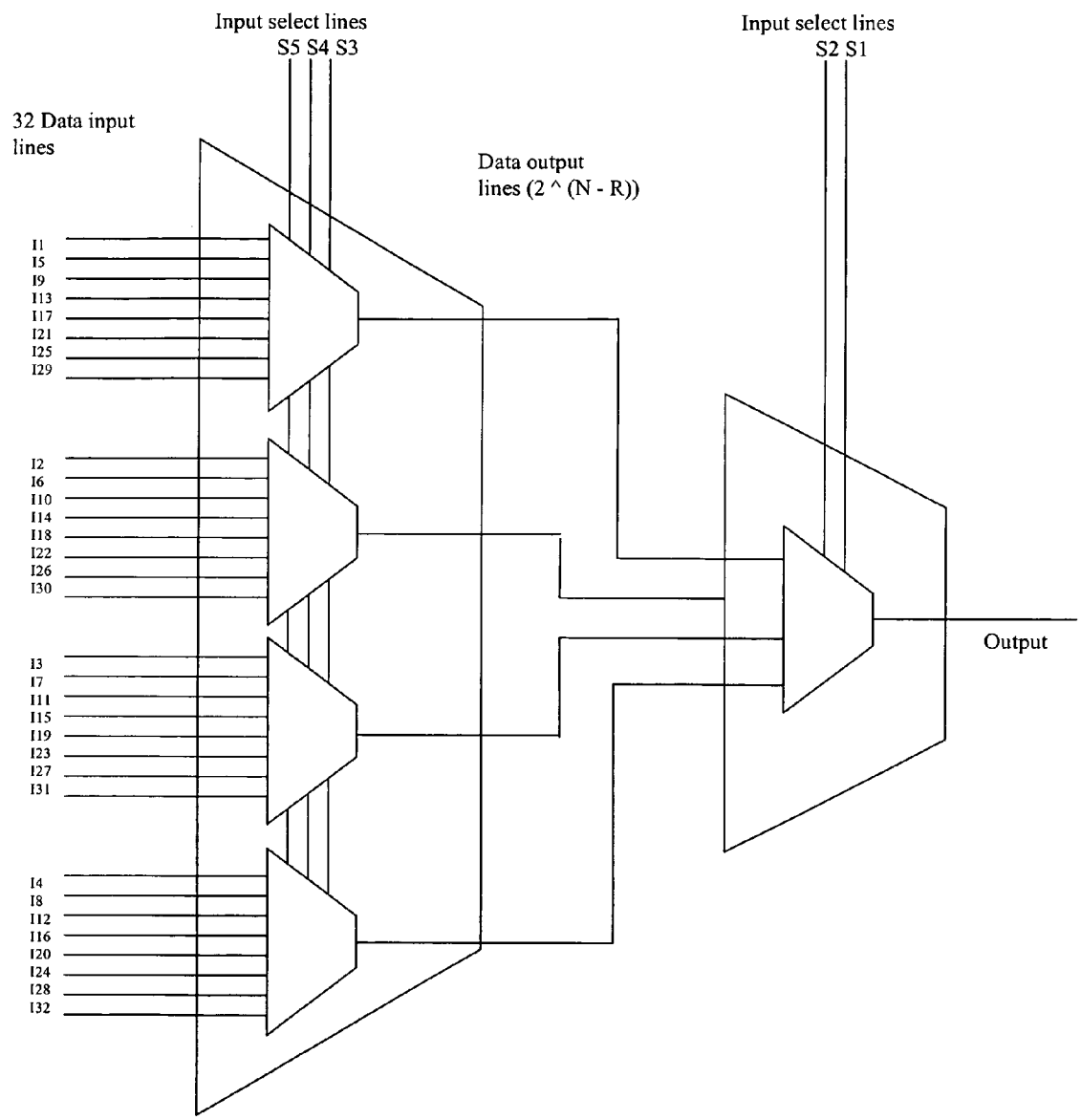
Figure 5). A 32:1 Multiplexer composed of 2 muxlets of size 3 & 2.

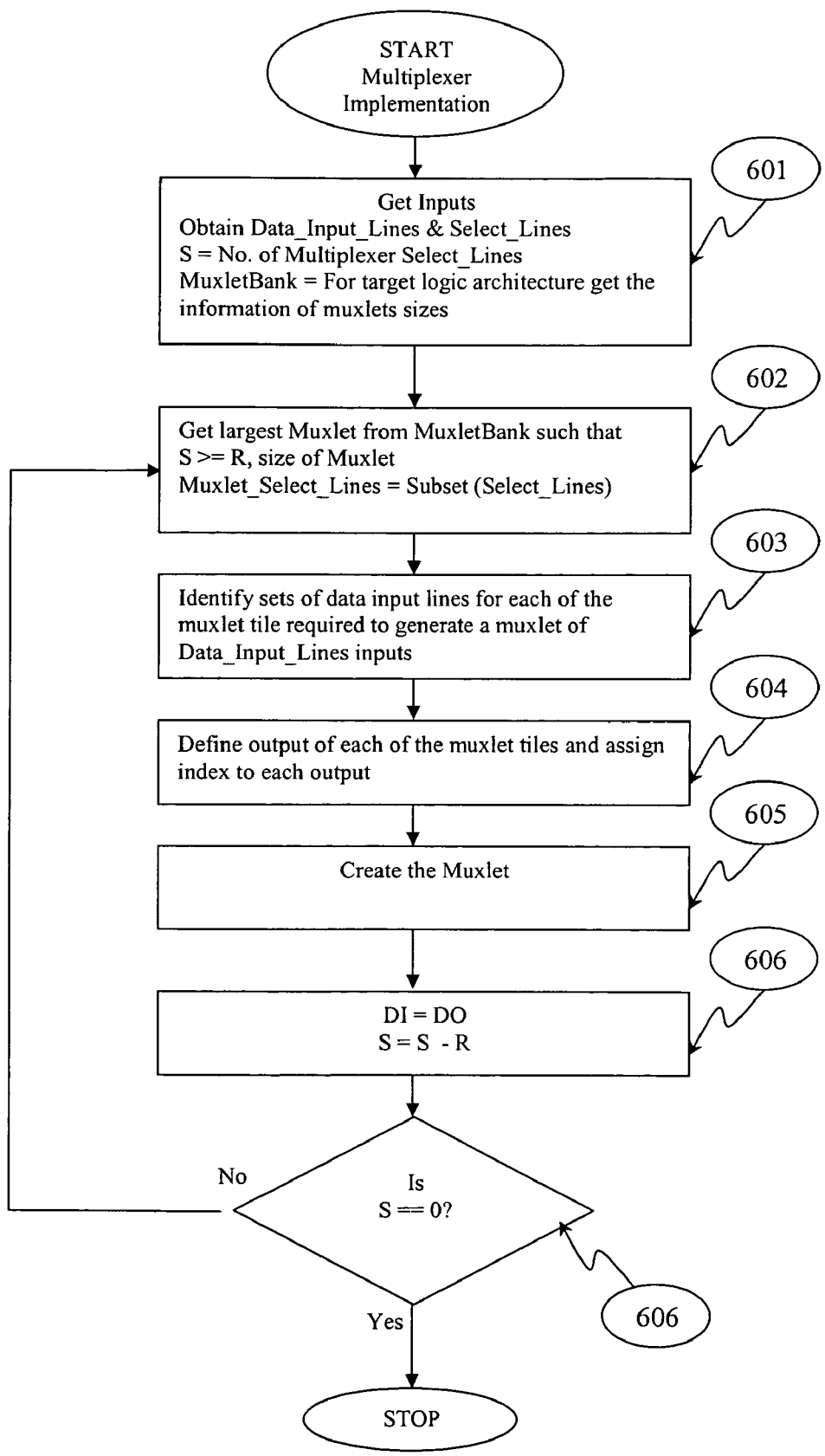
Figure 6. Implementing a multiplexer using muxlets for a given architecture

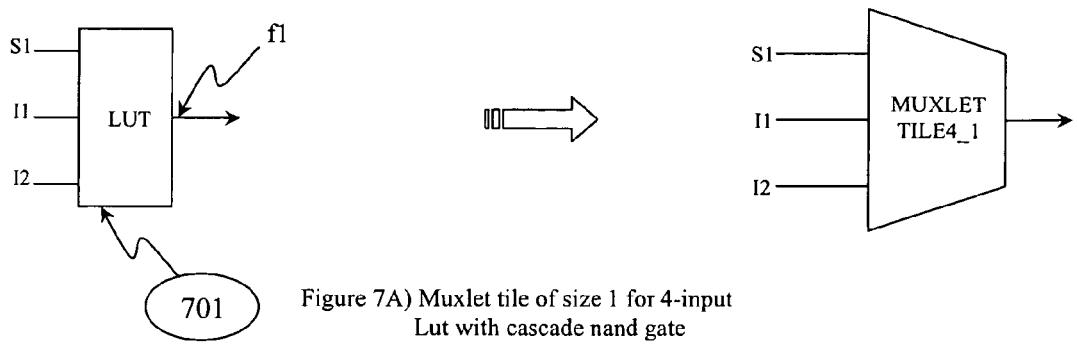
Figure 7A) Muxlet tile of size 1 for 4-input Lut with cascade nand gate
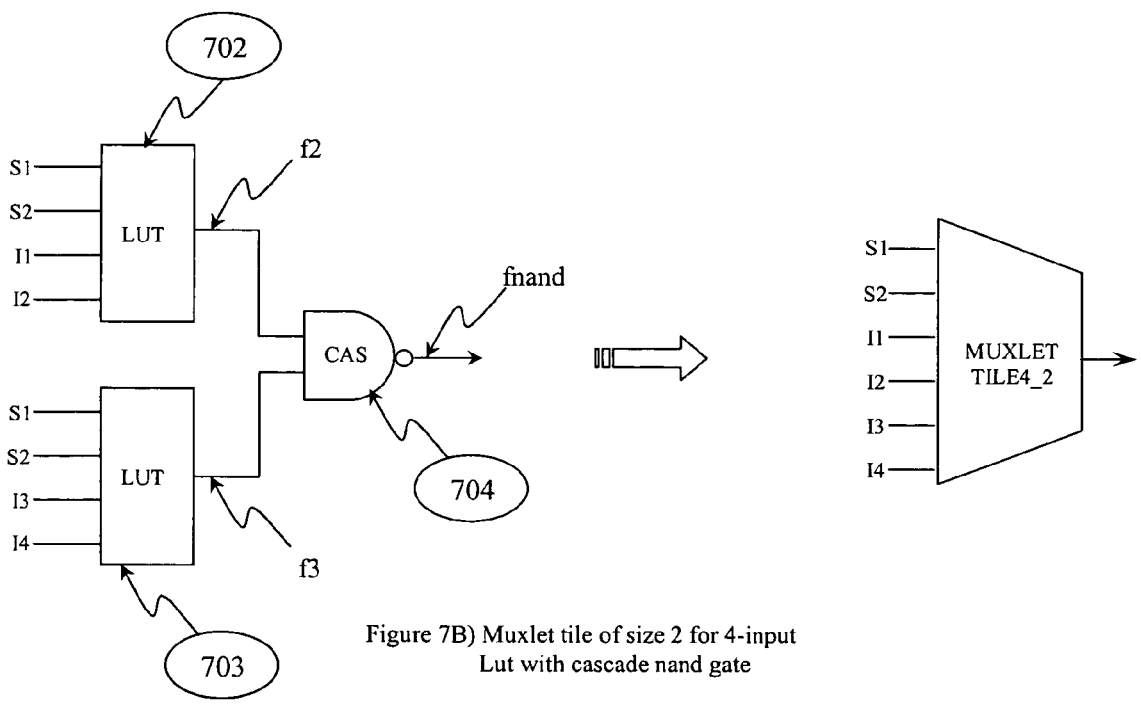
Figure 7B) Muxlet tile of size 2 for 4-input Lut with cascade nand gate

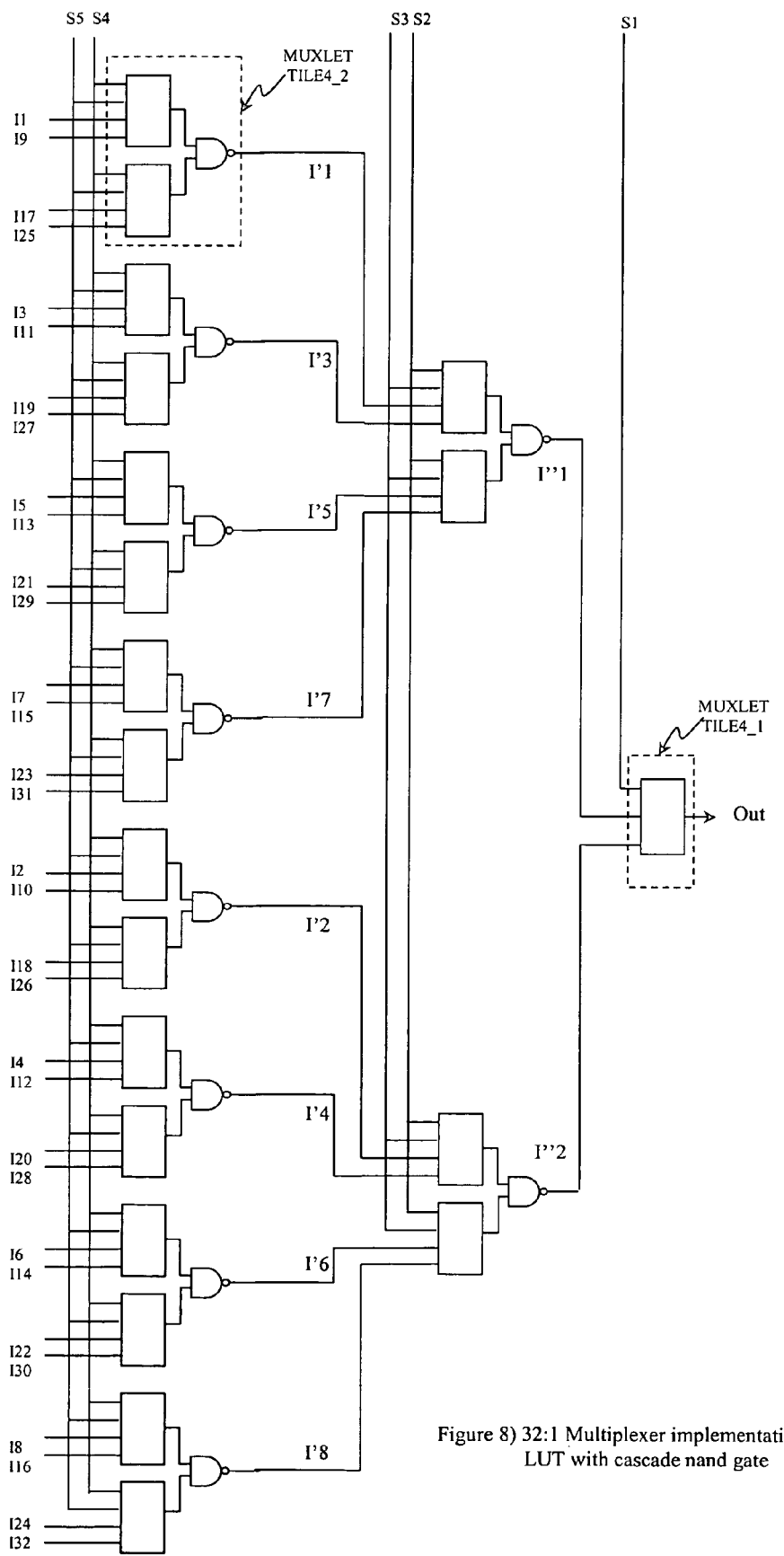
Figure 8) 32:1 Multiplexer implementation on a 4-input LUT with cascade nand gate

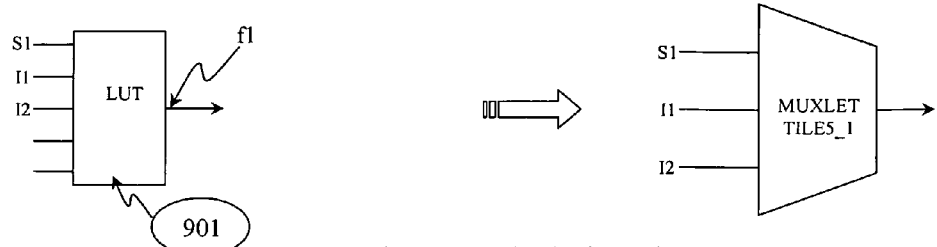
Figure 9A) Muxlet tile of size 1 for 5-input Lut with cascade and gate
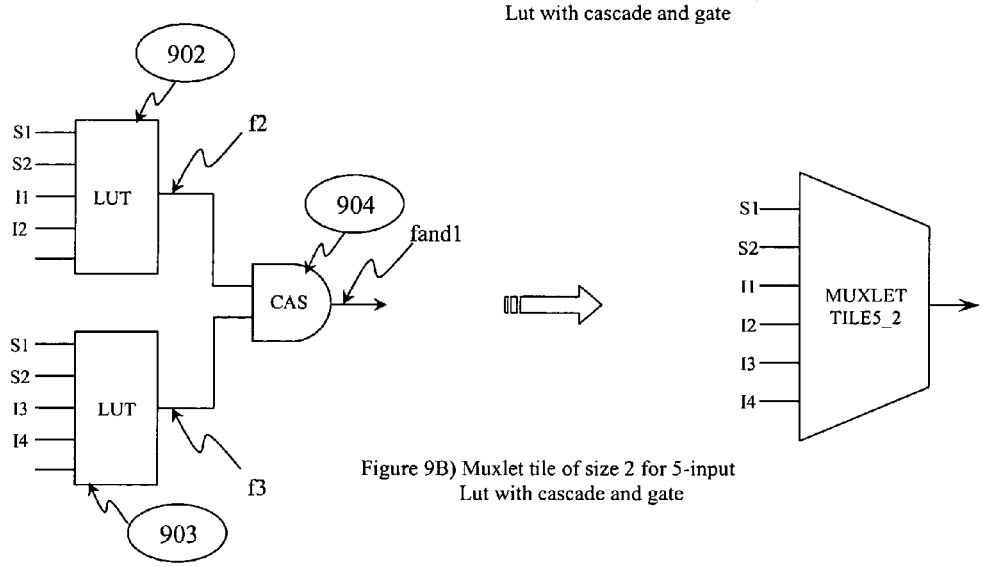
Figure 9B) Muxlet tile of size 2 for 5-input Lut with cascade and gate
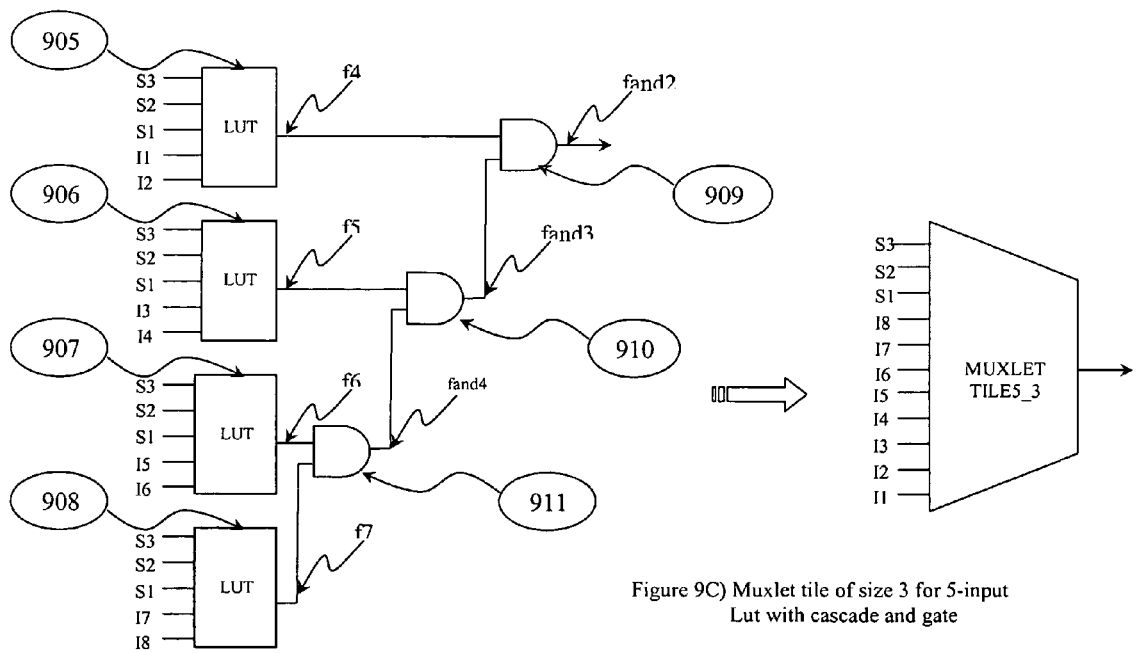
Figure 9C) Muxlet tile of size 3 for 5-input Lut with cascade and gate

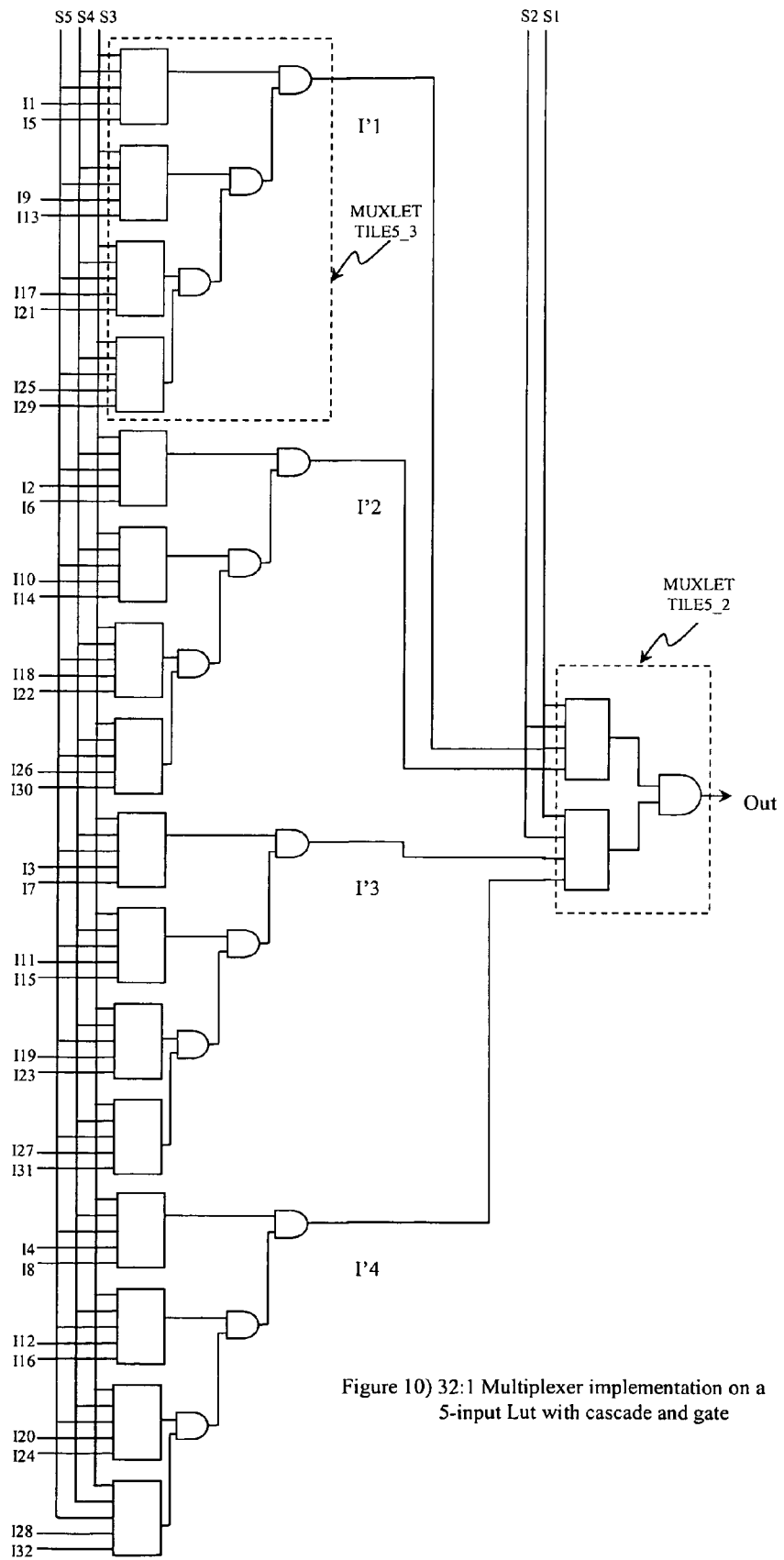
Figure 10) 32:1 Multiplexer implementation on a 5-input Lut with cascade and gate

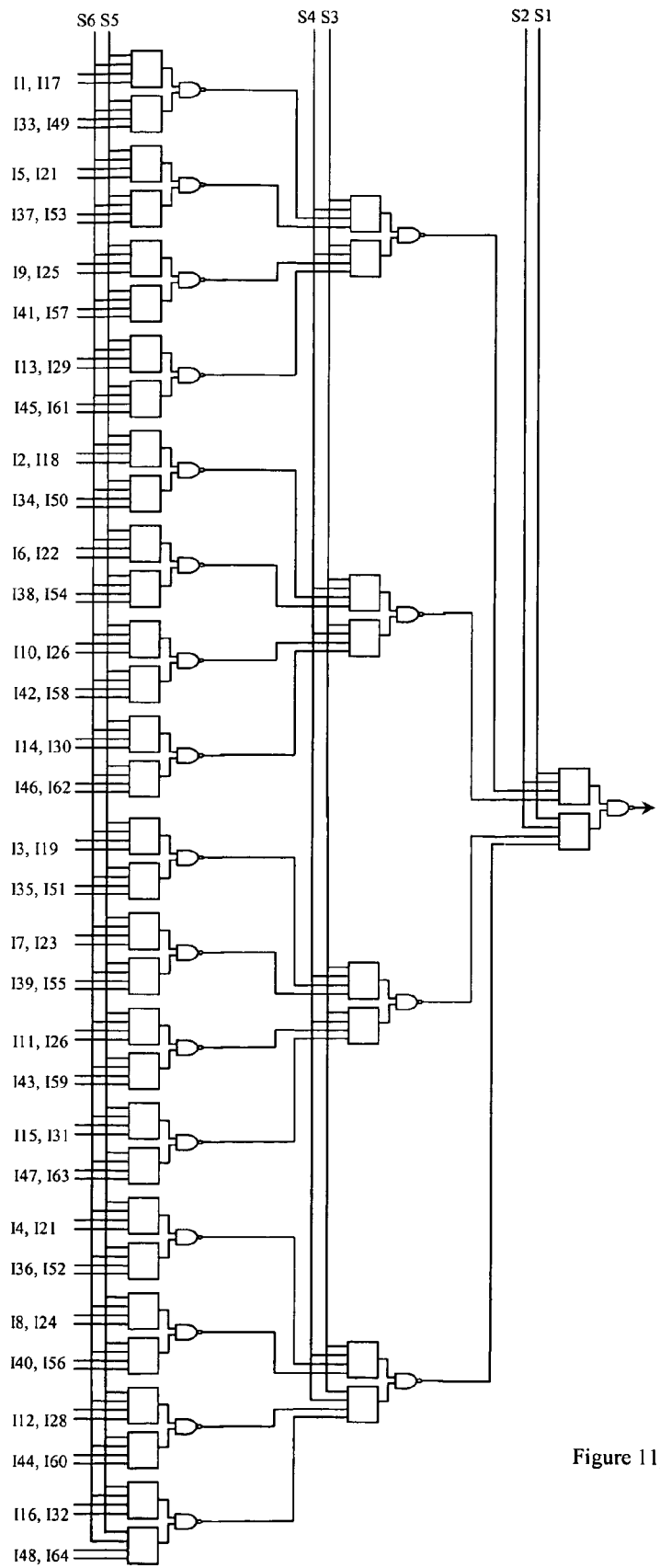
Figure 11) 64:1 Multiplexer implementation on a 4-input Lut with cascade nand gate

LUT BASED MULTIPLEXERS

CROSS-REFERENCE TO RELATED APPLICATION

This application is based upon and claims priority from prior Indian Patent Application No. 1817/Del/2004, filed on Sep. 24, 2004, the entire disclosure of which is herein incorporated by reference.

BACKGROUND OF THE INVENTION

1. Field of the Invention

The invention relates to an improved LUT based multiplexer architecture. More particularly, the invention relates to a method and apparatus for implementing multiplexers in Field Programmable gate arrays (FPGA) and other programmable devices that have a Lookup Table (LUT) based logic architecture.

2. Description of the Related Art

A multiplexer is a basic digital electronics component composed of n select lines and at most $2^n$ data lines. The multiplexer selects one of its inputs and provides it at its output according to the state of the select line/s. Multiplexers are typically used in digital Integrated Circuit (IC) designs by either direct use through schematic based design tools or indirectly through synthesis tools. The synthesis tools take designs expressed in Hardware Description Language (HDL) such as Verilog or VHDL as input and map them to the target technology. During the synthesis of a design, multiplexer components may be inferred amongst others, which are then mapped onto the target technology used for implementing these designs.

One such target technology used to implement IC design is the programmable integrated circuit. These programmable devices could be Field Programmable Gate Arrays (FPGAs).

A Lookup Table can be programmed to generate one or more than one output/s that correspond to a desired Boolean function of its inputs. The logic architecture of a LUT based programmable device is hierarchical in nature i.e. a few LUTs are grouped together along with additional components to form a logic cluster known as Configurable Logic Block (CLB) or Programmable Logic Block (PLB), etc. These logic clusters (CLBs) are interconnected through programmable routing resources. FIG. 1A and FIG. 1B illustrate an LUT based logic architecture configuration having logic elements, e.g. a logic gate or a multiplexer.

FIG. 2A shows a common implementation of multiplexers using LUTs. In this implementation the multiplexer is decomposed into a large number of smaller 2:1 multiplexers as shown in the Figure. These 2:1 multiplexers are implemented either in LUTs or special resources within the LUTs that are themselves 2:1 multiplexers.

In another implementation shown in FIG. 2B the multiplexer is realized using LUT based logic architecture. In this architecture the select lines are decoded by a logic element associated with each input. The signals corresponding to each input are then received and passed to the output through an OR gate as shown in the figure. The logic for decoding is implemented in LUTs while the OR gate can be a cascade gate chain.

In another prior art two 4-input LUTs are connected back to back to implement a 4:1 multiplexer as illustrated in FIG. 2C. Many such 4:1 multiplexers can then be connected to form a large multiplexer. U.S. Pat. No. 6,489,830 describes an invention for implementing a 4:1 multiplexer using two 4-input LUTs as shown in FIG. 2C. The drawback of this invention is that it increases the logic depth of the multiplexer logic thereby increasing the delay. Also this invention does not consider the use of additional resources (logic gates) available along with the LUT.

In another prior art a multiplexer is implemented using a horizontal chain of CLBs (available in a specific FPGA logic architecture) which makes the implementation conducive to better floor planning for certain types of design applications. One such implementation of multiplexer is described in U.S. Pat. No. 6,466,052. The architecture according to this patent is illustrated in FIG. 2D. In this patent 4 CLBs are used for implementing an 8:1 multiplexer on the Virtex-II FPGA using a distributed structure. The concept used for implementation of the multiplexer is also based on decoding the select lines for each input and then using an OR gate to generate a multiplexer. The OR gate horizontal chain which is a special resource available in the Xilinx Virtex-II FPGA is exploited to implement the OR gate. However this architecture requires a large number of LUTs for implementing a multiplexer.

In U.S. Pat. No. 6,505,337 shown in FIG. 2E a tree structure (basic concept illustrated in FIG. 2A) is used for implementation of a multiplexer but its implementation is based upon the specific resources that are available along with the LUT in a certain family of devices (Xilinx's Virtex FPGA series). These resources are known as F5 & F6 muxes. The 4-input LUT under this embodiment is used as a 2:1 multiplexer. A major disadvantage of this architecture is that it requires specialized resources (F5 & F6), which are device specific and may not be available in all types of programmable devices.

Further in the case of logic architecture that do not have the F5/F6 type of resources, the 2:1 multiplexer will be implemented using LUTs only. The number of LUTs required in this case will be $2^{(N-1)}+2^{(N-2)}+\ldots+2^0$. For N=7 the number of LUTs required will be 127 as compared to 85 when a carry/cascade chain is assumed. Therefore this architecture is not suitable for devices in which the specific resources F5/F6 are not available.

Furthermore in the same patent another method based on decoding (basic concept illustrated in FIG. 2B) of select lines for each input and then using an OR gate to generate a multiplexer is explained. Consider implementation of a multiplexer with 7 select lines using this prior art as shown in FIG. 1A using an LUT ONLY implementation. This method requires a total of more than 200 LUTs (16 LUTs for implementation of common product terms of 4 select lines (after optimization), $2^7=128$ LUTs for product terms of 3 select lines and each of the inputs, and $2^7/2=64$ LUTs for AND-OR). In case of implementing the multiplexer using LUT+CASCADE/CARRY the number of LUTs required will be in excess of $2^8=256$ (no optimization of common product terms of the 4 select lines is possible because of the use of cascade/carry chain). The large LUT requirement has been highlighted in the patent as it has been argued that this method is better only when the number of inputs is significantly less than $2^N$.

Accordingly, there exists a need for overcoming the disadvantages of the prior art as discussed above.

SUMMARY OF THE INVENTION

It is an object of the invention to obviate the above and other drawbacks from the prior art.

It is another object of the invention to provide an architecture for implementing a multiplexer, which is preferably based on partial decoding and/or partial tree architecture.

It is yet another object of the invention to provide an architecture for implementing multiplexers, which utilizes the additional resources present in the logic architecture optimally and provides a multiplexer implementation with a smaller logical depth while retaining a small number of LUTs.

It is a further object of the invention to provide an architecture for implementing a multiplexer that can be implemented on any commonly available programmable device.

It is yet a further object of the invention to provide an architecture for implementing a multiplexer, which is provided a compressed logic mapping and therefore can map large logic on a small area.

It is still another object of the invention to provide a method for multiplexer implementation for LUT based logic architecture that requires fewer number of LUTs than existing prior art.

It is still a further object of the invention to provide a multiplexer implementation method for LUT logic that requires least depth therefore providing a faster multiplexing without requiring additional area.

It is a further object of the invention to provide a method for implementing logic that utilizes the maximum capability of the available resources.

It is an additional object of the invention to provide a flexible multiplexer implementation using logic chains (carry-cascade) in a limited fashion thus imposing lesser constraint on the relative location of the constituent CLBs of the multiplexer implementation.

To achieve the above objectives and embodiment of the present invention provides an improved LUT based multiplexer, comprising:

a first set of muxlets, each receiving a subset of input data lines at its inputs; and one or more muxlet stages cascaded together to form a tree structure in which the roots are said first set of muxlets and the last stage of muxlet produces the final output.

The largest size muxlet defined is the smallest muxlet that can be implemented most efficiently on the selected logic architecture.

A muxlet comprises a plurality of muxlet tiles each of which multiplexes a subset of the muxlet inputs.

An embodiment of the present invention also provides an improved method for implementing LUT based multiplexers comprising:

defining the largest size of muxlet that can be efficiently implemented on the target logic architecture;

connecting the input lines to a plurality of muxlets of a size less than or equal to said largest size; and forming additional muxlets and cascading them together to generate the final multiplexed output.

BRIEF DESCRIPTION OF THE DRAWINGS

Other characteristics and advantages of the invention will become clear after reading the following description that is given for guidance and is in no way limiting, with reference to the attached drawings in which:

FIG. 1A shows LUT logic architecture with a cascade gate.

FIG. 1B shows LUT logic architecture with a carry multiplexer.

FIG. 2A shows a multiplexer implementation by generating a tree of 2:1 multiplexers.

FIG. 2B shows a multiplexer implementation using a complete decoding scheme.

FIG. 2C shows a multiplexer implementation using two 4-input LUTs

FIG. 2D shows a multiplexer implementation using four 4-input LUTs, carry chain, and horizontal OR chain on Virtex-II FPGA FIG. 2E shows a multiplexer implementation according to U.S. Pat. No. 6,505,337.

FIG. 3A shows a $2^n:1$ Multiplexer.

FIG. 3B shows a multiplexer implementation using a Muxlet.

FIG. 3C shows another multiplexer implementation using a Muxlet.

FIG. 4A shows an exemplary Muxlet.

FIG. 4B shows an exemplary Muxlet Tile.

FIG. 4C shows another exemplary Muxlet composed of Tiles.

FIG. 5 shows a 32:1 Multiplexer composed of 2 Muxlets.

FIG. 6 shows an implementation of a multiplexer using Muxlets.

FIG. 7A shows a Muxlet Tile of size 1 for 4-input LUT with cascade nand gate.

FIG. 7B shows a Muxlet tile of size 2 for 4-input LUT with cascade nand gate.

FIG. 8 shows a 32:1 Multiplexer implementation on a 4-input LUT with cascade nand gate.

FIG. 9A shows a Muxlet tile of size 1 for 5-input LUT with cascade and gate.

FIG. 9B shows a Muxlet tile of size 2 for 5-input LUT with cascade and gate.

FIG. 9C shows a Muxlet tile of size 3 for 5-input LUT with cascade and gate.

FIG. 10 shows a 32:1 multiplexer implementation on a 5-input LUT with cascade and gate.

FIG. 11 shows a 64:1 Multiplexer implementation on a 4-input LUT with cascade nand gate.

DETAILED DESCRIPTION

The FIGS. 1A, 1B, 2A, 2B, 2C, 2D, 2E, have already been described in detail above under the heading "BACKGROUND OF THE INVENTION".

According to an embodiment of the present invention a multiplexer is implemented in a number of stages where each stage is of size R and is termed as a muxlet. The first stage (first muxlet) of the multiplexer takes as input some select lines of the multiplexer and all data inputs. A muxlet performs partial multiplexing by producing output data lines that are multiplexed from the input data lines that are greater in number by a factor of $2^R$. The multiplexing is based on the value (signal value) of R input select lines. The resultant output is used as data input for the next stage. Many such stages (muxlets) form a tree structure to implement the multiplexer. Thus each muxlet decodes the input data lines based on the value of some select lines and many such muxlets form a tree structure to implement the multiplexer.

FIGS. 3A to 3C illustrate an exemplary muxlet and the construction of a multiplexer. FIG. 3A shows a $2^N:1$ multiplexer comprising muxlets. For a given logic architecture a certain number of muxlets can be defined. Each of these muxlets has a characteristic number of select lines that are input to it. A multiplexer can be implemented using these muxlets. For implementing an N select line multiplexer a combination of muxlets with select lines R1, R2 . . . Rm can be used. The largest size muxlet defined is the smallest muxlet that can be implemented most efficiently on the logic architecture. The other muxlets are created so that the N select line multiplexer can be composed by the combination of these and the most optimum muxlet. The flowchart of FIG. 6 explains (discussed in detailed later) how a multiplexer is implemented for a given logic architecture using muxlets defined for that logic architecture. The muxlet definition for a given logic architecture is a key aspect of the invention.

FIG. 3B shows a multiplexer implementation according to an embodiment of the invention using two muxlets. The first muxlet uses R1 select lines out of N select lines and multiplexes $2^N$ input to produces $2^{(N-R1)}$ outputs. In the subsequent stage the second muxlet uses the remaining select line and the outputs of the previous muxlet to realize a $2^N$:1 multiplexer. Similarly FIG. 3C shows a multi stage multiplexer according to an embodiment of the present invention in which recursive formation of the muxlets creates a final multiplexer.

FIGS. 4A to 4C show a detailed structure of a muxlet. FIG. 4A shows a muxlet that receives R select lines, $2^N$ input lines and produces a $2^{(N-R)}$ output. A muxlet is composed of a muxlet tile that takes ($2^R$) input data lines and gives one output data line, many such tiles are placed together to make a ($2^N$) input data line muxlet. The inputs of the muxlet tiles are identified such that the state of each select line decodes which input of the muxlet is to be propagated to the output. An exemplary muxlet tile is shown in FIG. 4B. The muxlet comprising muxlet tiles is shown in FIG. 4C.

The muxlet and muxlet tile implementation for a few LUT based logic architectures through examples has been explained in the subsequent discussion. However a person of ordinary skill in the art will appreciate, in view of the present discussion, that the invention is not limited to these examples only. The method for generating muxlet and muxlet tiles can be applied to other logic architectures that may not be explicitly mentioned here without deviating from the scope of the present invention.

A muxlet can be generated using one or more muxlet tiles. According to one possible method a muxlet tile can be created for R select lines and $2^R$ data lines providing a single output data line. Each tile is configured to decode the input data line for a specific logic value of the select lines. The data lines that have the same value of select lines for the next stage of muxlet (i.e. the remaining select lines) are grouped together within a tile. This arrangement is illustrated in FIG. 5. Note that this arrangement leaves some flexibility for arranging the data input lines within the muxlet tile.

According to another possible method for creating muxlet tiles of an embodiment for LUT based logic architectures having carry/cascade chains such as those described in FIGS. 1A and 1B.

FIG. 7A and FIG. 9A show a further exemplary method for implementing muxlet tile for two input and one select line using an 3 and 5 input LUT respectively.

FIG. 7B and FIG. 9B show another exemplary method for implementing a muxlet tile for 4 data lines and 2 select lines using two, 4 and 5 input LUTs and a cascade logic gate.

FIG. 9C shows another implementation for a muxlet tile for 8 data and 3 select lines using a 5 input LUT and cascade gates.

The muxlet tile of size 1 is an LUT that takes as input 1 select line and two data lines as shown in FIG. 7A. The functionality of the LUT 701 is as defined by f1. The muxlet tile of size two has two LUTs and a cascade gate as shown in FIG. 7B. The functionality of the two LUTs 702 & 703 is as defined by f2 and f3 respectively and that of the cascade gate 704 (nand gate) is as defined by fnand. The function f1, f2, f3, and fnand can be written as follows:

$$f1=(S1 \& I1)+(\sim S1 \& I2)$$

$$f2=(S2+\sim I1) \& (S2+\sim S1+\sim I2)$$

$$f3=(\sim S2+S1+\sim I3) \& (\sim S2+\sim S1+\sim I4)$$

$$f\text{nand}=\sim(f2 \& f3)=\sim f2+\sim f3$$

Similarly for a 5-input LUT architecture shown in FIGS. 9A, FIG. 9B, and FIG. 9C the following is true.

The muxlets of size 3, 2 & 1 are defined for such logic architecture. The muxlet tile of size 1 will use one 5 input LUT 901 having functionality f1 (see FIG. 9A). A muxlet tile of size 2 will be implemented using two LUTs, 902 & 903 and a cascade gate 804 having functionality f2, f3 and fand1 respectively (see FIG. 9B). A muxlet of size 3 will have 4 LUTs (905, 906, 907, 908) and 3 cascade gates (909, 910, 911) having functionality f4, f5, f6, f7 and fand2, fand3, fand4 respectively (see FIG. 9C). These functions are as follows:

$$f1=(S1 \& I1)+(\sim S1 \& I2)$$

$$f2=(\sim S2 \& \sim S1 \& I1)+(\sim S2 \& S1 \& I2)+S2$$

$$f3=(S2 \& \sim S1 \& I3)+(S2 \& S1 \& I4)+\sim S2$$

$$f\text{and}1=f2 \& f3$$

$$f4=(\sim S3 \& S2 \& \sim S1 \& I1)+(\sim S3 \& \sim S2 \& S1 \& I2)+\\(\sim S3 \& S2)+(S3)$$

$$f5=(\sim S3 \& S2 \& \sim S1 \& I3)+(\sim S3 \& S2 \& S1 \& I4)+\\(\sim S3 \& S2)+(S3)$$

$$f6=(S3 \& \sim S2 \& \sim S1 \& I5)+(S3 \& \sim S2 \& S1 \& I6)+\\(S3 \& S2)+(\sim S3)$$

$$f7=(S3 \& S2 \& \sim S1 \& I7)+(S3 \& S2 \& S1 \& I8)+(S3\\ \& \sim S2)+(\sim S3)$$

$$f\text{and}2=f4+f\text{and}3$$

$$f\text{and}3=f\text{and}4+f5$$

$$f\text{and}4=f6+f7$$

For a logic architecture having a carry multiplexer chain the multiplexer can be configured to work as a AND gate by connecting the zero input logic of the multiplexer to logic zero.

A number of muxlet tiles of various sizes (R1 to Rm) are defined each of size 1 to m. A multiplexer of N select lines and $2^N$ data input lines can now be generated for the given architecture using the steps illustrated in FIG. 6.

In FIG. 6, step 601 involves arranging the input select lines in an array of Select_Lines, the input data lines along with their index in Data_Input_Lines and finally the Muxlet Bank that has information regarding the sizes of muxlets available for the targeted logic architecture. In this step we initialize the number of select lines S.

In step 602 we find the best muxlet of size R available for implementation of a S select line multiplexer such that R<=S. As an example consider that for a given logic architecture there are muxlets of size 1, 2, 3 & 4 then if S=7 we will choose R=4 but if S=3 then we choose R=3.

In step 603 we first identify the number of muxlet tiles that will be required for the Data_Input_Lines. If number of Data_Input_Lines are $2^N$ (or less than $2^N$ but greater than $2^{(N-1)}$) then number of muxlet tiles required will be $2^{(N-R)}$. For each tile we identify the inputs to that tile. Each tile is assigned a number from 1 to $2^{(N-R)}$. The index of each data input line is considered and two numbers (X,Y) are generated from the number Z=(index-1). Masking off the first R bits (MSB) of the number Z generates a number X'. This number X', incremented by 1 corresponds to the muxlet tile number X to which this data input line will be connected. The remaining part of the Z (first R bits) is right shifted by (N−R); the resultant number incremented by 1 is Y. Y corresponds to the index of the muxlet tile input to which this data input line will connect. As an example consider N=5, R=2 and the data input line index be 12. Then the muxlet tile number will be 4 (12−1=11=01011 in binary; masking first 2 bits we get 3; increment by 1 we get 4). The index number to which this line will be connected will be 2 (1+1). For further clarification one can refer to the FIG. 8. In this figure the input data line I12 is the $2^{nd}$ input to muxlet tile 4 having output line as I'4.

In step 604 we assign the output line index as the number of the corresponding muxlet tile. This index will serve as input for the generation of the next stage muxlet.

In step 605 we generate the actual muxlet by making the connections as identified and generating the new output lines.

In step 606 the inputs for the next stage of muxlet are prepared. The Data_Input_Lines are assigned the data output lines of the muxlet just generated along with index values. Refer to FIG. 8, where the lines marked I'1 to I'8 are the input to the next stage. The value of S is decreased by a value R.

In the step 607 it is checked whether or not an additional muxlet stage is required. If no additional stage is required then the output of the previous stage is the final output of the multiplexer otherwise, step 602 onwards is repeated.

The FIG. 8 illustrates the implementation of a 32 to 1 multiplexer (5 select lines). The arrangement of input data lines calls for special attention.

FIG. 10 and FIG. 11 illustrate multiplexer possible embodiments according to the present invention for a 32:1 multiplexer implementation on a 5-input Lut with cascaded AND gate and a 64:1 Multiplexer implementation on a 4-input Lut with cascaded nand gate respectively.

ADVANTAGES OF THE INVENTION

The present invention provides many advantages over the existing art. Some of the prominent advantages are listed below however, a person of ordinary skill in the art in view of the present discussion will appreciate that the advantages of the invention are not limited to these aspects alone.

1. The partial-decode and tree method of the invention is applicable to a wide variety of LUT based logic architectures that generally have common resources such as carry or cascade gate chains.
2. The number of LUTs required to implement multiplexer by the partial-decode and tree method is far less than in the methods of the prior art.
3. The LUT logic depth of the multiplexer generated by the partial-decode and tree method is half as compared to prior art that uses same number of LUTs except for the fact that additional resource (carry or cascade chains) are not used in the prior art. Since these resources are generally attached to an LUT in most logic architectures therefore there is no extra area required.
4. The partial-decode and tree method makes use of all inputs of a LUT i.e. it uses the k-input LUT as a function of k inputs. Thus the method uses the full capacity of an LUT.
5. The partial-decode and tree method uses the chains (carry-cascade) in a limited fashion thus imposing less constraint on the relative location of the constituent CLBs of the multiplexer implementation.

In particular an embodiment of the present invention provides the following advantages.

The proposed method when applied to the Virtex-II logic architecture would take 5 LUTs and use the carry chain (con-figured as AND gate) within the CLB while still providing the flexibility of implementing a multiplexer in a distributed fashion. The partial-decode method provides flexibility of distribution in both dimensions. The horizontal chain structure will require 2 data inputs in one CLB (vertical routing channel) and also requires 4 CLBs to be horizontally adjacent (as they need to be chained). In comparison to this, partial-decode method implementation needs 4 data inputs to be clustered into one CLB (using only one slice of the CLB) and the other CLBs may be placed anywhere, as they don't use any chains between them, which would have constrained their relative location. Thus the partial-decode and tree method would require 5 LUTs to implement a 8:1 multiplexer that has horizontal as well as vertical distribution flexibility; without using special horizontal chains that may not be available in our FPGA logic architectures.

Further, an embodiment of the present invention requires as few as 85 LUTs (85) for the discussed example whereas a prior art implementation would require more than 200 LUTs.

While there has been illustrated and described what is presently considered to be embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A look-up table (LUT) based multiplexer having multiplexer input data lines and a multiplexer final output, comprising:
   input select lines;
   input data lines, each input data line having a respective index;
   a first multiplexer stage having an input and receiving multiplexer input data lines at its input, the first multiplexer stage comprising a set of muxlets, each muxlet having an input and all the muxlets receiving a subset of the multiplexer input data lines at its input, the first multiplexer stage having an output and output data lines at its output;
   a second multiplexer stage having an input and input data lines at its input, the output data lines of the first multiplexer stage being connected directly to the input data lines of the second multiplexer stage, the second multiplexer stage having an output and a single data line at its output, the second multiplexer stage comprising a muxlet; and
   a LUT based logic architecture adapted to:
   select a muxlet size by selecting a largest size muxlet from a bank of available muxlets of more than one size, such that the muxlet size R selected is less than or equal to N, where N is the number of select lines and $2^N$ is the number of input data lines,
   identify a number of tiles required for the input data lines,
   for each tile, identify inputs to the tile,
   assign a number from 1 to $2^{N-R}$ to each tile,
   for each input data line,
   generate a binary number Z equal to the respective index minus 1, generate a number X formed by masking the R most significant bits of Z, wherein X+1 is a tile number to which the input data line is connected, and generate a number Y equal to the R most significant bits of Z right shifted by N−R, wherein Y+1 is the index of a tile input to which the input data line is connected, assign an output line index as the number of the corresponding tile, generate a muxlet by making connections as identified in the preceding steps, and generating new output lines, assign to input data lines of a next muxlet the data output lines of a preceding muxlet and respective index values, decrease value of N by R, and repeat the preceding steps until no additional muxlet is required to implement the multiplexer;

whereby the first and second stages cascaded together form a tree structure in which all the inputs to the first stage are roots of the LUT based multiplexer and the second stage produces a final output of the LUT based multiplexer at the multiplexer final output.

2. The LUT based multiplexer of claim 1, wherein the largest size muxlet defined is the smallest muxlet that can be implemented most efficiently on the selected logic architecture.

3. The LUT based multiplexer of claim 1, wherein a muxlet comprises a plurality of muxlet tiles each of which multiplexes a subset of muxlet inputs.

4. The LUT based multiplexer of claim 1 in which none of the input data lines of the second multiplexer stage are connected directly to the multiplexer input data lines.

5. An integrated circuit comprising:
an electronic circuit; and
at least one multiplexer based on partial decoding using look-up table (LUT) based logic architecture, comprising:
input select lines;
input data lines, each input data line having a respective index;
a first set of muxlets, each receiving a subset of input data lines at its inputs, and
two muxlet stages cascaded together to form a tree structure in which the roots are the first set of muxlets and a last stage of muxlet produces a final output, thereby providing compressed logic mapping and thereby reducing LUT logic depth of the multiplexer,
wherein the LUT based logic architecture is adapted to:
select a muxlet size by selecting a largest size muxlet from a bank of available muxlets of more than one size, such that the muxlet size R selected is less than or equal to N, where N is the number of select lines and $2^N$ is the number of input data lines,
identify a number of tiles required for the input data lines,
for each tile, identify inputs to the tile,
assign a number from 1 to $2^{N-R}$ to each tile,
for each input data line,
generate a binary number Z equal to the respective index minus 1,
generate a number X formed by masking the R most significant bits of Z, wherein X+1 is a tile number to which the input data line is connected, and generate a number Y equal to the R most significant bits of Z right shifted by N−R, wherein Y+1 is the index of a tile input to which the input data line is connected, assign an output line index as the number of the corresponding tile, generate a muxlet by making connections as identified in the preceding steps, and generating new output lines, assign to input data lines of a next muxlet the data output lines of a preceding muxlet and respective index values, decrease value of N by R, and repeat the preceding steps until no additional muxlet is required to implement the multiplexer.

6. The integrated circuit of claim 5, wherein:
the largest size muxlet defined is the smallest muxlet that can be implemented most efficiently on the selected logic architecture.

7. The integrated circuit of claim 5, wherein:
a muxlet comprises a plurality of muxlet tiles each of which multiplexes a subset of muxlet inputs.

8. A method of implementing a multiplexer having N select lines and $2^N$ input data lines, the multiplexer including a plurality of muxlets, comprising the steps of:
providing input select lines;
providing input data lines and a respective index of each input data line;
providing a bank of available muxlets, the available muxlets being of more than one size;
for each muxlet of a multiplexer to be implemented, selecting a muxlet size by selecting a largest size muxlet from the bank of available muxlets such that the muxlet size R selected is less than or equal to N, where N is the number of select lines and $2^N$ is the number of input data lines of the multiplexer;
identifying a number of tiles required for the input data lines;
for each tile, identifying inputs to the tile;
assigning a number from 1 to $2^{N-R}$ to each tile;
for each input data line,
generating a binary number Z equal to the respective index minus 1,
generating a number X formed by masking the R most significant bits of Z, wherein X+1 is a tile number to which the input data line is connected, and
generating a number Y equal to the R most significant bits of Z right shifted by N−R, wherein Y+1 is the index of a tile input to which the input data line is connected;
assigning an output line index as the number of the corresponding tile;
generating a muxlet by making connections as identified in the preceding steps, and generating new output lines;
assigning to input data lines of a next muxlet of the multiplexer the data output lines of a preceding muxlet and respective index values;
decreasing value of N by R; and
repeating the preceding steps until no additional muxlet is required to implement the multiplexer.

* * * * *